United States Patent
Kao (10) Patent No.: US 9,853,653 B2
(45) Date of Patent: Dec. 26, 2017

(54) ERROR CANCELLATION IN A CURRENT DIGITAL-TO-ANALOG CONVERTER OF A CONTINUOUS-TIME SIGMA-DELTA MODULATOR

(71) Applicant: MediaTek Inc., Hsin-Chu (TW)

(72) Inventor: Tsung-Kai Kao, Jhubei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/259,292

(22) Filed: Sep. 8, 2016

(65) Prior Publication Data
US 2017/0077936 A1 Mar. 16, 2017

Related U.S. Application Data

(60) Provisional application No. 62/218,766, filed on Sep. 15, 2015.

(51) Int. Cl.
| | |
|---|---|
| *H03M 1/06* | (2006.01) |
| *H03M 1/66* | (2006.01) |
| *H03M 3/00* | (2006.01) |
| *H03M 1/08* | (2006.01) |
| *H03M 1/74* | (2006.01) |

(52) U.S. Cl.
CPC .......... *H03M 1/06* (2013.01); *H03M 1/0863* (2013.01); *H03M 1/66* (2013.01); *H03M 3/50* (2013.01); *H03M 1/742* (2013.01)

(58) Field of Classification Search
CPC ........... H03M 1/06; H03M 3/50; H03M 1/66; H03M 1/1023; H03M 1/747

USPC ......................... 341/118, 121, 119, 144, 143
See application file for complete search history.

(56) References Cited

U.S. PATENT DOCUMENTS

| | | | | | |
|---|---|---|---|---|---|
| 5,283,631 | A | * | 2/1994 | Koerner | G01R 31/2841 326/121 |
| 6,720,898 | B1 | * | 4/2004 | Ostrem | H03M 1/0648 341/144 |
| 6,833,801 | B1 | | 12/2004 | Ostrem et al. | |
| 6,956,417 | B2 | * | 10/2005 | Bernstein | H03L 7/093 327/157 |
| 8,441,382 | B2 | * | 5/2013 | Mahajan | H03K 17/063 341/121 |
| 9,136,854 | B1 | * | 9/2015 | Hong | H03M 1/66 |
| 2002/0109541 | A1 | | 8/2002 | Ferianz | |
| 2007/0236375 | A1 | | 10/2007 | Andre | |

OTHER PUBLICATIONS

Extended European Search Report for Application No. EP 16188829.2 dated Feb. 6, 2017.

* cited by examiner

*Primary Examiner* — Jean B Jeanglaude
(74) *Attorney, Agent, or Firm* — Wolf, Greenfield & Sacks, P.C.

(57) ABSTRACT

Apparatus and methods for reducing noise and distortion in current digital-to-analog converters (IDACs). Compensating capacitors may be connected to current sources in an IDAC. The compensating capacitors may be driven with signals 5 derived from the output of the IDAC to cancel transient current spikes that would otherwise occur on the output of the IDAC.

27 Claims, 4 Drawing Sheets

ERROR CANCELLATION IN A CURRENT DIGITAL-TO-ANALOG CONVERTER OF A CONTINUOUS-TIME SIGMA-DELTA MODULATOR

RELATED APPLICATIONS

This application claims the benefit of U.S. provisional Application Ser. No. 62/218,766, titled "CTSDM IDAC Dynamic Error (ISI) Cancellation Technique," filed on Sep. 15, 2015. The entire disclosure of the foregoing application is incorporated herein by reference.

BACKGROUND

Technical Field

The technology relates to circuitry and methods for cancelling a source of error in a sigma-delta modulator that can lead to conversion errors in analog-to-digital converters.

Discussion of the Related Art

Analog-to-digital converters (ADCs) are widely used in various electronic apparatus and systems such as mobile phones, audio equipment, image-capture devices, video equipment, communications systems, sensors and measurement equipment, and radar systems, among other applications. A typical ADC is an electronic circuit configured to receive an analog signal, which typically is a time-varying signal, repeatedly sample the analog signal at discrete time intervals, and output a digital signal (e.g., a bit sequence or digital word) for each sampled time interval that is representative of a value of the analog signal during the sampling interval. Because the output of an ADC is an N-bit sequence, the analog signal is discretized into a number $M=2^N$ of integer values. The number N is referred to as the bit resolution of the ADC. For example, if a single-ended ADC is an 8-bit device, then an input signal can be discretized into $2^N=256$ values (0, 1, 2, 3 . . . 255).

There are several types of conventional ADCs, and they may be divided into two groups: ADCs with single-bit quantization (e.g., a comparator) and ADCs with multi-bit quantization (e.g., N-bit ADCs). Multibit quantizing ADCs may include voltage-controlled-oscillator (VCO)-based ADCs, sigma-delta ADCs, successive-approximation-register ADCs, and flash ADCs, among others. The multibit, sigma-delta ADCs are finding increasing use in wireless and wireline communication systems. Although these types of ADCs are slower than flash ADCs, for example, they are capable of very high bit resolution and high conversion accuracy. An aspect of a sigma-delta ADC is that its sigma-delta modulator can introduce error into its output, which can lead to inter-symbol interference and signal conversion errors.

SUMMARY

Circuitry and methods associated with reducing a source of error in sigma-delta modulators, for example, are described. A sigma-delta modulator may include a current digital-to-analog converter (IDAC) that includes one or more switched current sources configured to drive one or more analog outputs of the IDAC. The current sources may have associated capacitances. The switching of the current sources can generate current spikes on the output of the IDAC. These current spikes can contribute to noise and inter-symbol interference in a sigma-delta analog-to-digital converter in some cases. Compensating capacitors may be connected to the current sources and driven with signals to reduce the current spikes.

Some embodiments relate to a current digital-to-analog converter (IDAC) comprising at least one of a first current source arranged to provide current to a first output and a second current source arranged to pull current from the first output, at least one of a first compensating capacitor connected to the first current source and a second compensating capacitor connected to the second current source, and driving circuitry configured to supply current to the at least one of the first compensating capacitor and the second compensating capacitor.

Some embodiments relate to a current digital-to-analog converter (IDAC) comprising a first current source arranged to provide current to a first output and/or a second current source arranged to pull current from the first output, a first compensating capacitor connected to the first current source, when present, and/or a second compensating capacitor connected to the second current source, when present, and driving circuitry configured to supply current to the first compensating capacitor, when present, and/or the second compensating capacitor, when present.

The first compensating capacitor and the second compensating capacitor may be arranged to compensate for associated capacitances of the first current source and the second current source.

The IDAC may further comprise a first switch located between the first current source and the first output and a second switch located between the first output and the second current source. In some implementations, the IDAC may further comprise a first switch and a second switch arranged to intermittently conduct current to and from the first output.

The driving circuitry may be configured to be switched to receive and amplify, with an amplifier, a signal from the first output with a same signal that controls the first switch.

The IDAC may be connected in a sigma-delta modulator, wherein the sigma-delta modulator has a sampling frequency and an operating bandwidth of the amplifier is approximately equal to or greater than the sampling frequency. The driving circuitry may comprise an amplifier having a gain between approximately 1.5 and approximately 2.7.

The amplifier may comprises a first input connected to a reference voltage and a second input connected to switches that are arranged to connect the second input to either the first output of the IDAC or a second output of the IDAC.

The amplifier may have an operating bandwidth between approximately 2 GHz and approximately 4 GHz.

The IDAC may further comprise a second output, a third switch connected between the first current source and the second output, and a fourth switch connected between the second output and the second current source. In some implementations, the IDAC may comprise a second output, a third switch, and a fourth switch arranged to conduct current intermittently to and from the second output.

The first switch and the fourth switch may be configured to be controlled by a same signal, and the second switch and the third switch may be configured to be controlled by a same signal.

The driving circuitry may include an amplifier that comprises a first input connected to a reference voltage and a second input connected to switches that are arranged to connect the second input to either the first output of the IDAC or the second output of the IDAC.

The second input of the amplifier may connect to a fifth switch that is configured to be controlled by a same signal that controls the first switch and the fourth switch, and the second input of the amplifier may connect to a sixth switch that is configured to be controlled by a same signal that controls the second switch and the third switch.

The IDAC may further comprise a summing node connected to receive the first output and an input signal for conversion, an integrator connected to receive an output from the summing node, and a comparator having an input connected to receive an output of the integrator and an output connected to an input of the IDAC.

Some embodiments relate to a current digital-to-analog converter (IDAC) comprising a first current source arranged to provide current to or pull current from a first output, a first compensating capacitor connected to the first current source, a reference node arranged to connect the first output to a reference potential, and driving circuitry configured to supply current to the first compensating capacitor.

The first compensating capacitor may be arranged to compensate for associated capacitance of the first current source.

In some aspects, the IDAC may further comprise a first switch located between the first current source and the first output and a second switch located between the first output and the reference node.

In some cases, the driving circuity may be configured to be switched to receive and amplify, with an amplifier, a signal from the first output with a same signal that controls the first switch.

In some implementations, the IDAC may be connected in a sigma-delta modulator, wherein the sigma-delta modulator has a sampling frequency and an operating bandwidth of the amplifier is approximately equal to or greater than the sampling frequency.

The driving circuitry may comprise an amplifier having a gain between approximately 1.5 and approximately 2.7.

In some implementations, the IDAC may further comprise a second output, a third switch connected between the first current source and the second output, and a fourth switch connected between the second output and the reference node.

Some embodiments relate to methods for converting a digital signal to an analog signal. A method may comprise acts of driving a first switch connected between a first current source and a first output with a first signal, amplifying a signal from the first output when the first switch is driven to connect the first current source and the first output, and providing the amplified signal from the first output to a first compensating capacitor connected to the first current source.

A method for converting a digital signal to an analog signal may further comprise driving a second switch connected between the first output and a second current source with a second signal, and providing an inverse of the amplified first signal from the first output to a second compensating capacitor connected to the second current source.

The act of amplifying may comprise amplifying the first signal with a gain between 1.5 and 2.7.

A method for converting a digital signal to an analog signal may further comprise selecting a capacitance of the first compensating capacitor to be essentially equal to an associated capacitance of the first current source that is connected in parallel with the first current source.

A method may further comprise driving a third switch connected between the first current source and a second output with the second signal, and driving a fourth switch connected between the second output and the second current source with the first signal.

A method for converting a digital signal to an analog signal may further comprise amplifying a second signal from the second output when the second switch is driven to connect the second current source and the first output, and providing the amplified second signal from the second output to the first compensating capacitor and an inverse of the amplified second signal to a second compensating capacitor connected to the second current source.

A method may further comprise providing a signal from the first output to a summing node of a sigma-delta modulator.

The foregoing apparatus and method embodiments may be included in any suitable combination with aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit and/or with other circuits on a substrate.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

Figure 1:
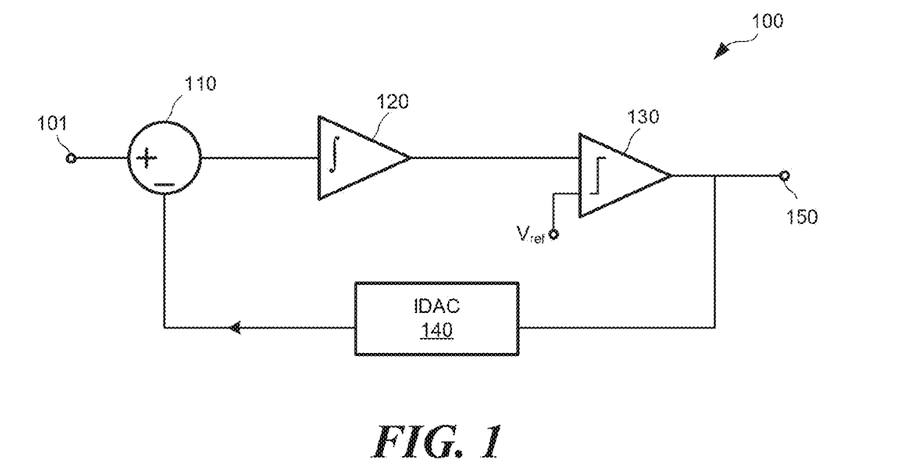
FIG. 1 depicts a sigma-delta modulator, according to some embodiments.

An example of a sigma-delta modulator 100, which may be used in a sigma-delta converter, is depicted in FIG. 1. The illustrated example is for instructional purposes only, and is not intended to limit the structure of sigma-delta modulators. FIG. 1 depicts a first-order sigma-delta modulator, but the invention is not limited to first-order modulators. Error cancellation of the present embodiments may be used with higher-order modulators, such as second and third-order sigma-delta modulators.

A sigma-delta modulator may be included in a front end of a sigma-delta converter, in some embodiments, and be configured to receive an analog signal at an input 101 and output a stream of digital pulses at an output 150. The sigma-delta modulator may operate as a continuous-time modulator, in some implementations. A first-order sigma-delta modulator may comprise a summing node 110, and integrator 120, a comparator 130, and a feedback loop having a current digital-to-analog converter (IDAC) 140. A portion of the output from the comparator is fed back through the IDAC 140 and converted from a digital signal to an analog signal at the IDAC 140. The analog signal from the IDAC is provided to the summing node 110 and is subtracted from the input signal. A pulse stream from the comparator 130 may be provided to the output 150 and sent to a counter (not shown). The counter may count the number of pulses during a sampling time interval to determine a digital signal level that corresponds to the sampled analog signal level received at the input 101.

Figure 2:
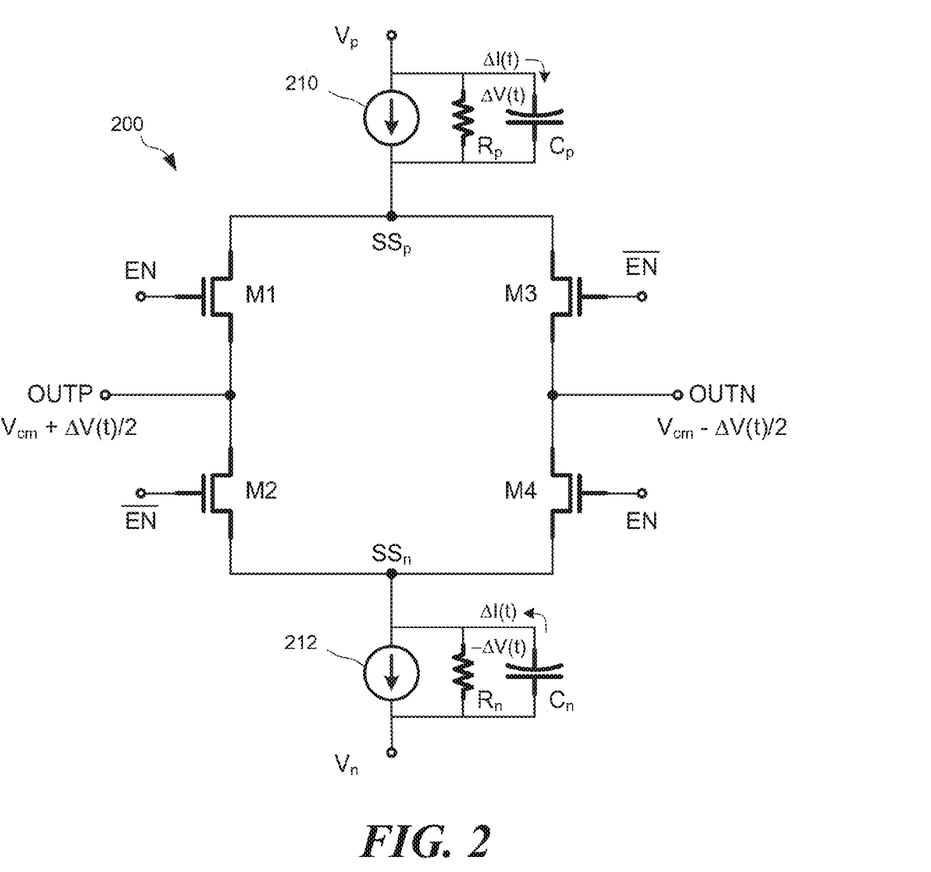
FIG. 2 depicts a current digital-to-analog (IDAC) circuit, according to some embodiments.

Further details of an IDAC 140 are depicted in the IDAC circuit 200 shown in FIG. 2, for example. According to some embodiments, an IDAC 200 may comprise push and pull current sources 210, 212 that are switched on and off to push and pull current to and from first and second outputs OUTP, OUTN. The switching of the current sources 210, 212 may be done by transistors M1, M2, M3, and M4 which are driven with a pulsed signal (e.g., from the comparator 130) and its inverse applied to inputs EN, $\overline{EN}$. The outputs OUTP, OUTN may be applied as a differential pair to summing node 110, or one output may be grounded and the other applied to summing node 110. The current sources may be essentially the same circuitry and configured to connect to supplies $V_p$, which may be any suitable DC voltage supplies.

The inventor has recognized and appreciated that current sources 210, 212 typically are of similar or same design and may have associated resistances $R_p$ and capacitances $C_p$, which can be modeled as elements connected in parallel with each source, as indicated in FIG. 2. The associated resistances $R_p$ and capacitances $C_p$ may be parasitic, discrete elements, or a combination of parasitic and discrete elements. Small voltage jumps can occur at summing junctions in the IDAC and result in current spikes at the outputs of the IDAC. Integration of the current spikes by an integrator in the sigma-delta converter can then lead to conversion errors. In some cases, the current spikes contribute to noise and inter-symbol interference, which can result in conversion errors.

Figure 3A:
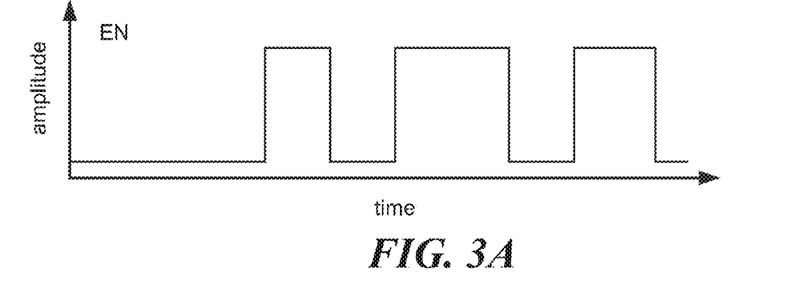
FIG. 3A illustrates a switching control for an IDAC, according to some embodiments.
Figure 3B:
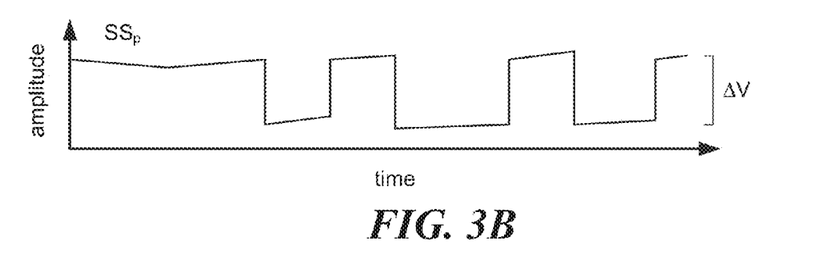
FIG. 3B illustrates voltage at a node $SS_p$ of an IDAC as depicted in FIG. 2, according to some embodiments.
Figure 3C:
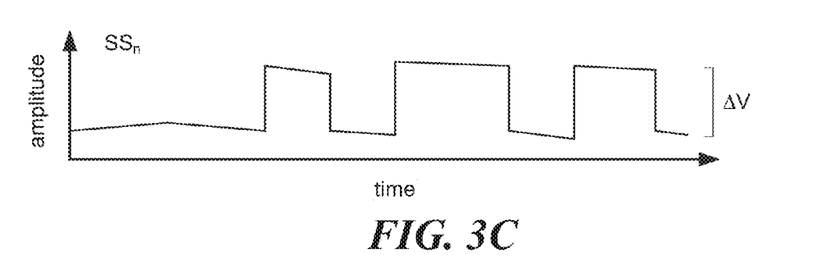
FIG. 3C illustrates voltage at a node $SS_n$ of an IDAC as depicted in FIG. 2, according to some embodiments.
Figure 3D:
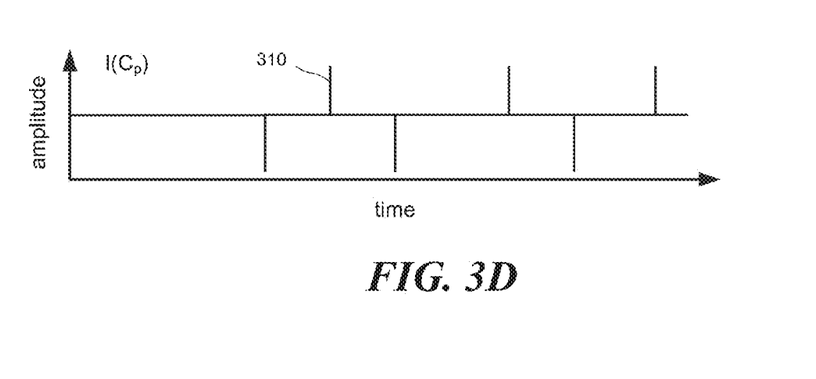
FIG. 3D illustrates current spikes occurring in an IDAC, according to some embodiments.

FIG. 3A depicts an example of a pulsed signal that may drive the IDAC circuit of FIG. 2, according to some embodiments. For example, the signal EN of FIG. 3A may be applied to the EN inputs of the IDAC circuit 200 and its inverse may be applied to the $\overline{EN}$ inputs of the IDAC. The pulsed signal may be output from the comparator 130. The rapid switching of the current sources 210, 212 results in small voltage deviations $\Delta V(t)$, $-\Delta V(t)$, shown in FIG. 3B and FIG. 3C, at nodes $SS_p$ and $SS_n$, respectively. These voltage jumps are opposite-going signals that can result from charging and discharging of the associated capacitances $C_p$, $C_n$ by currents $\Delta I(t)$. The voltage jumps also result in current spikes 310 on the IDAC's outputs, of which an example for OUTP is depicted in FIG. 3D. The current spikes will be of opposite sign for OUTN. These current spikes may be integrated by integrator 120 in the sigma-delta modulator, and result in small errors that are added to the integrated analog signal. These errors can lead to analog-to-digital conversion errors.

Figure 4A:
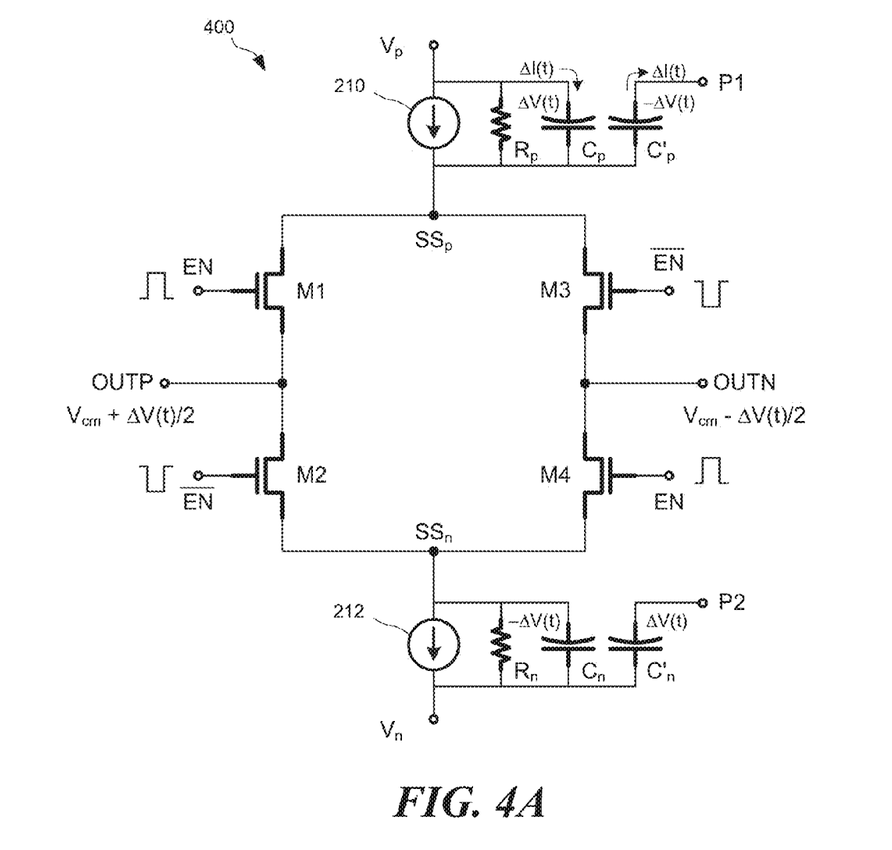
FIG. 4A and FIG. 4B depict a modified current digital-to-analog (IDAC) circuit that compensates for associated capacitances, according to some embodiments.

The inventor has recognized and appreciated that the voltage jumps and current spikes can be effectively canceled in some implementations by adding compensating capacitors $C_p'$, $C_n'$ in a compensated IDAC circuit 400, and driving the compensating capacitors with currents of approximately the same magnitude and opposite sign, as depicted in FIG. 4A. The compensating capacitors may have approximately a same value as their counterparts ($C_p' \cong C_p$, $C_n' \cong C_n$). By adding compensating capacitors and associated current drivers, any current that would charge an associated capacitor is essentially nulled by current supplied by the driver to the compensating capacitor.

According to some embodiments, the values of the compensating capacitors may be determined through circuit simulations. For example, the circuit of FIG. 4A may be modeled and solved for high-speed operation. For the compensating capacitors, negative capacitance values may be added and connected to ground. The simulations may sweep the modulation frequencies for each negative capacitance value tried, and high-frequency corners for output impedances of the IDAC may be monitored. The negative capacitance values may be altered to move the high-frequency corners out to higher frequencies, and a corresponding positive capacitance value selected for the negative compensating capacitance that yields the highest frequency corner.

Figure 4B:
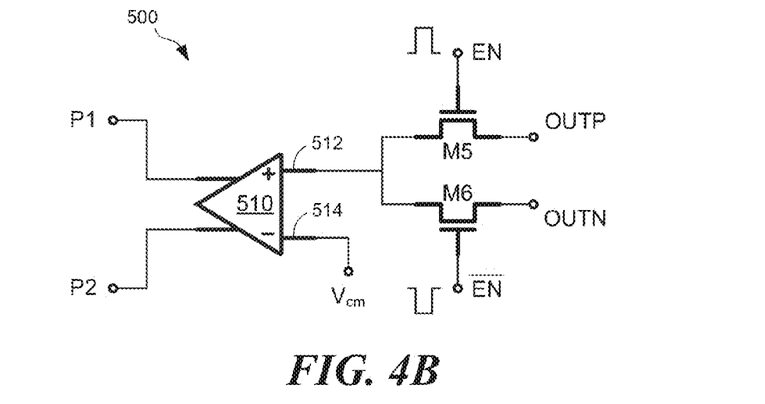

A driver circuit 500 for driving the compensating capacitors $C_p'$, $C_n'$ is depicted in FIG. 4B, according to some embodiments. The driver circuit 500 may comprise a low-gain, open loop amplifier 510 having differential outputs. In some embodiments, the gain of amplifier 510 may be adjustable. The amplifier 510 may have an operating bandwidth that is as great as or greater than the sampling frequency of a sigma-delta converter in which the IDAC 400 is incorporated. An inverting input 514 of the amplifier may connect to a reference voltage $V_{cm}$ that is essentially equal to an average output voltage of the IDAC. A non-inverting input 512 of the amplifier may connect to switching circuitry that alternately provides signal from one of the two outputs OUTP, OUTN of the IDAC 400. The switching circuitry may comprise transistors M5, M6, which may be driven by the same two signals EN, $\overline{EN}$ that drive transistors M1, M2, M3, and M4 of the IDAC 400.

In some implementations, $V_{cm}$ may be the common mode signal input to the modulator 100 and may be obtained from the input 101. The input 101 may comprise a differential input that receives two input signals INp, INn (used in an analog-to-digital conversion, for example). $V_{cm}$ may be obtained with a summing and divide circuit that takes the average of the two signals, (INp+INn)/2.

In some embodiments, an appropriate amount of current may be provided to the compensating capacitors by a driver circuit that applies voltages to the compensating capacitors $C_p'$, $C_n'$ that are proportional to the voltage jumps at nodes $SS_p$, $SS_n$ but of opposite sign. For example, a voltage that is approximately twice the magnitude of the voltage jump $\Delta V$ at node $SS_p$ or $SS_n$ may be applied across the compensating capacitors. The voltage jump $\Delta V$ may be detected at the outputs OUTP, OUTN, according to some embodiments.

In some implementations, the outputs from the amplifier 510 connect directly to the two compensating capacitors $C_p', C_n'$ (e.g., pins P1 connect together and pins P2 connect together in FIG. 4A and FIG. 4B). In some embodiments, there may be attenuators and/or phase shifters connected between the amplifier's outputs and the compensating capacitors to adjust the signals fed back to the IDAC 400. In some cases, the amplifier's gain may be adjustable by components internal to the amplifier 510. The gain of the amplifier 510 may be between approximately 1.5 and approximately 2.7, according to some embodiments. In some embodiments, a bandwidth of the amplifier may be between approximately 2 GHz and approximately 4 GHz.

Figure 5:
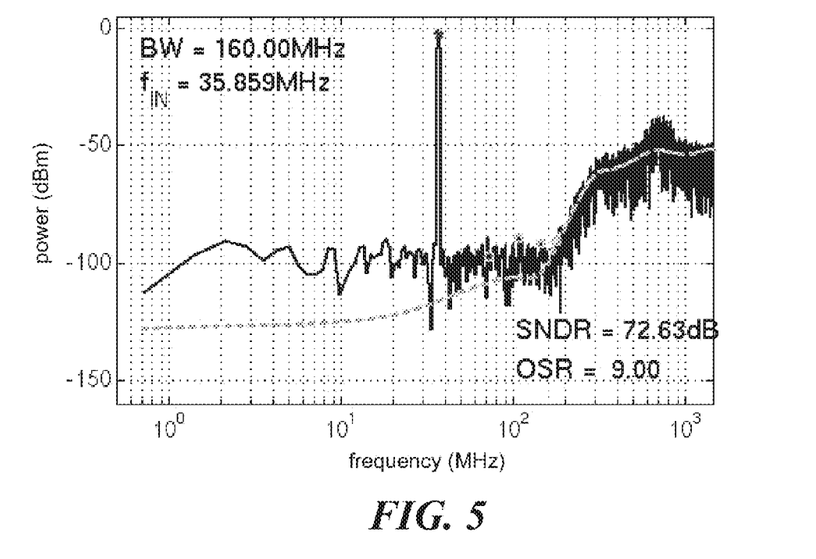
FIG. 5 illustrates simulated signal-to-noise plus distortion ratio for an IDAC that does not compensate for associated capacitances, according to some embodiments.
Figure 6:
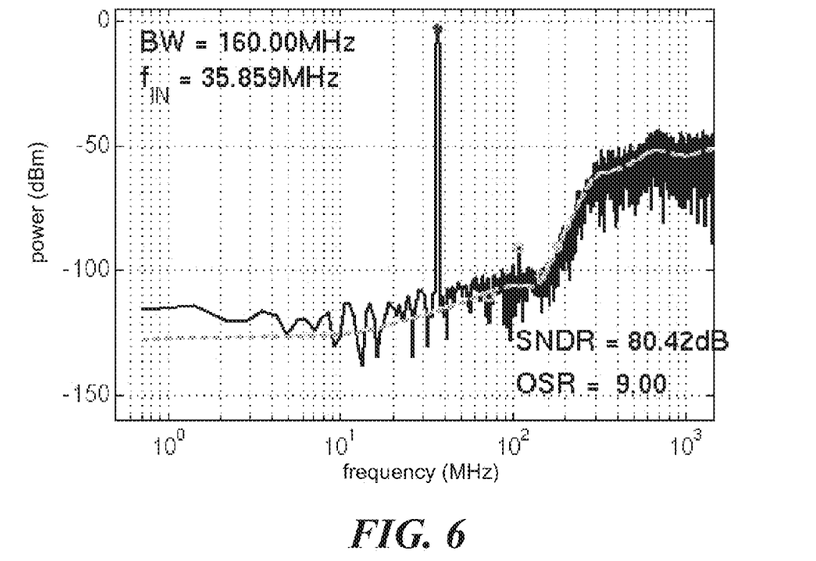
FIG. 6 illustrates simulated signal-to-noise plus distortion ratio for an IDAC that includes compensation for associated capacitances, in accordance with the present embodiments.

Simulated spectra for sigma-delta modulators are shown in FIG. 5 and FIG. 6. In FIG. 5, simulations were carried out for an IDAC in which the associated capacitance values were taken to be 10 femtofarads. The input modulation frequency was about 36 MHz and the over-sampling ratio was 9. A sampling frequency for the modulator was about 2.9 GHz, and a loop bandwidth for the modulator was about 160 MHz. The simulated output power spectrum from the IDAC is plotted over a range of frequencies between about 1 MHz and about 1 GHz (dark curve). Also plotted (light dashed curve) is a power spectrum indicating a theoretical amount of quantization noise for the sigma-delta modulator. The calculated signal-to-noise plus distortion ratio is approximately 72.6 dB.

FIG. 6 plots a simulated output power spectrum for a similar IDAC that includes compensating capacitors $C_p', C_n'$ and a current-driving circuit 500. The noise power spectrum reduces appreciably, as can be seen in comparison with FIG. 5. The calculated signal-to-noise plus distortion ratio increases to approximately 80.4 dB, an improvement of about 8 dB.

Although the above embodiments have been described in connection with a sigma-delta modulator, compensating capacitors may be used in a current digital-to-analog converter used for other purposes. The compensating capacitors may be connected to either side of the current sources 210, 212, and not only to the nodes shown in the drawings. The sign or direction of the driving current or applied voltage may reverse when connecting a compensating capacitor to the other side of a current source. In some embodiments, the compensating capacitors may be connected to the current sources 210, 212, such that a same sign of current or voltage may be used to drive each capacitor. In that case, the amplifier 510 may be a unipolar or single-sided output amplifier.

A compensating capacitor and associated driver may also be implemented in a unipolar IDAC. For example and referring again to FIG. 4A, the second current source 212 is used to provide a bipolar output from the IDAC. In some implementations, the second current source may be replaced with a reference node that is arranged to connect to a reference potential, such as ground. Therefore, only a single compensating capacitor $C_p'$ and associated unipolar driver may be needed. Alternatively, the second current source 212 may be used and the first current source 210 may be replaced with a reference node arranged to connect to a reference potential for negative-going, unipolar outputs, and only a single compensating capacitor $C_n'$ may be needed. In other words, an IDAC according to some embodiments may comprise one or both of the first current source 210 and the second current source 212, one or both of the first compensating capacitor $C_p'$ and the second compensating capacitor $C_n'$, and the driving circuitry 500 may be configured to supply current to one or both of the first compensating capacitor $C_p'$ and the second compensating capacitor $C_n'$.

Methods for operating IDACs are also contemplated. According to some embodiments, a method may comprise acts of driving a first switch M1 connected between a first current source 210 and a first output OUTP with a first signal, and driving a second switch M2 connected between the first output and a second current source 212 with a second signal. A method may also include amplifying a signal from the first output when the first switch is driven to connect the first current source and the first output, and providing the amplified signal from the first output to a first compensating capacitor $C_p'$ connected to the first current source. A method of operating an IDAC may further include acts of driving a third switch M3 connected between the first current source and a second output OUTN with the second signal, and driving a fourth switch M4 connected between the second output and the second current source with the first signal. In some aspects, a method may also include amplifying a second signal from the second output when the second switch is driven to connect the second current source and the first output, and providing the amplified second signal from the second output to the first compensating capacitor and to a second compensating capacitor connected to the second current source. Additional and alternative acts can be appreciated from the foregoing description taken in conjunction with the drawings. For example, the acts may differ accordingly when the second current source is replaced with a reference node that is arranged to connect to a reference potential, such as ground, and only a single compensating capacitor $C_p'$ and associated driver is needed. Alternatively, the acts may differ accordingly when the first current source 210 is replaced with a reference node arranged to connect to a reference potential for negative-going output, and only a single compensating capacitor $C_n'$ is needed.

CONCLUSION

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements).

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A current digital-to-analog converter (IDAC) comprising:
   a first current source arranged to provide current to a first output and/or a second current source arranged to pull current from the first output;
   a first compensating capacitor connected to the first current source and/or a second compensating capacitor connected to the second current source; and
   driving circuitry configured to supply current to the first compensating capacitor and/or the second compensating capacitor.

2. The IDAC of claim 1, wherein the first compensating capacitor and the second compensating capacitor are arranged to compensate for associated capacitances of the first current source and the second current source.

3. The IDAC of claim 1, further comprising a first switch and a second switch arranged to intermittently conduct current to and from the first output.

4. The IDAC of claim 3, wherein the driving circuity is configured to be switched to receive and amplify, with an amplifier, a signal from the first output with a same signal that controls the first switch.

5. The IDAC of claim 4, connected in a sigma-delta modulator, wherein the sigma-delta modulator has a sampling frequency and an operating bandwidth of the amplifier is approximately equal to or greater than the sampling frequency.

6. The IDAC of claim 1, wherein the driving circuitry comprises an amplifier having a gain between approximately 1.5 and approximately 2.7.

7. The IDAC of claim 6, wherein the amplifier comprises:
   a first input connected to a reference voltage; and
   a second input connected to switches that are arranged to connect the second input to either the first output of the IDAC or a second output of the IDAC.

8. The IDAC of claim 6, wherein the amplifier has an operating bandwidth between approximately 2 GHz and approximately 4 GHz.

9. The IDAC of claim 1, further comprising:
   a second output; and
   a third switch and a fourth switch arranged to conduct current intermittently to and from the second output.

10. The IDAC of claim 9, wherein the first switch and the fourth switch are configured to be controlled by a same signal, and the second switch and the third switch are configured to be controlled by a same signal.

11. The IDAC of claim 9, wherein the driving circuitry includes an amplifier that comprises:
    a first input connected to a reference voltage; and
    a second input connected to switches that are arranged to connect the second input to either the first output of the IDAC or the second output of the IDAC.

12. The IDAC of claim 11, wherein the second input of the amplifier connects to a fifth switch that is configured to be controlled by a same signal that controls the first switch and the fourth switch, and wherein the second input of the amplifier connects to a sixth switch that is configured to be controlled by a same signal that controls the second switch and the third switch.

13. The IDAC of claim 1, further comprising:
    a summing node connected to receive the first output and an input signal for conversion;
    an integrator connected to receive an output from the summing node; and
    a comparator having an input connected to receive an output of the integrator and an output connected to an input of the IDAC.

14. A current digital-to-analog converter (IDAC) comprising:
    a first current source arranged to provide current to or pull current from a first output;
    a first compensating capacitor connected to the first current source;
    a reference node arranged to connect the first output to a reference potential; and
    driving circuitry configured to supply current to the first compensating capacitor.

15. The IDAC of claim 14, wherein the first compensating capacitor is arranged to compensate for associated capacitance of the first current source.

16. The IDAC of claim 14, further comprising:
    a first switch located between the first current source and the first output; and
    a second switch located between the first output and the reference node.

17. The IDAC of claim 16, wherein the driving circuity is configured to be switched to receive and amplify, with an amplifier, a signal from the first output with a same signal that controls the first switch.

18. The IDAC of claim 17, connected in a sigma-delta modulator, wherein the sigma-delta modulator has a sampling frequency and an operating bandwidth of the amplifier is approximately equal to or greater than the sampling frequency.

19. The IDAC of claim 14, wherein the driving circuitry comprises an amplifier having a gain between approximately 1.5 and approximately 2.7.

20. The IDAC of claim 14, further comprising:
    a second output;
    a third switch connected between the first current source and the second output; and a fourth switch connected between the second output and the reference node.

21. A method for converting a digital signal to an analog signal, the method comprising:
driving a first switch connected between a first current source and a first output;
amplifying a first signal from the first output when the first switch is driven to connect the first current source and the first output; and
providing the amplified first signal from the first output to a first compensating capacitor connected to the first current source.

22. The method of claim 21, further comprising:
driving a second switch connected between the first output and a second current source with a second signal; and
providing an inverse of the amplified first signal from the first output to a second compensating capacitor connected to the second current source.

23. The method of claim 22, further comprising:
driving a third switch connected between the first current source and a second output with the second signal; and
driving a fourth switch connected between the second output and the second current source with the first signal.

24. The method of claim 23, further comprising:
amplifying a second signal from the second output when the second switch is driven to connect the second current source and the first output; and
providing the amplified second signal from the second output to the first compensating capacitor and an inverse of the second signal to a second compensating capacitor connected to the second current source.

25. The method of claim 21, wherein the amplifying comprises amplifying the first signal with a gain between 1.5 and 2.7.

26. The method of claim 21, further comprising selecting a capacitance of the first compensating capacitor to be essentially equal to an associated capacitance of the first current source that is connected in parallel with the first current source.

27. The method of claim 21, further comprising providing a signal from the first output to a summing node of a sigma-delta modulator.

* * * * *

UNITED STATES PATENT AND TRADEMARK OFFICE
CERTIFICATE OF CORRECTION

PATENT NO. : 9,853,653 B2  
APPLICATION NO. : 15/259292  
DATED : December 26, 2017  
INVENTOR(S) : Tsung-Kai Kao Page 1 of 1

It is certified that error appears in the above-identified patent and that said Letters Patent is hereby corrected as shown below:

In the Abstract:
The number "5" after the word "signals" and before the word "derived" should be deleted.

Signed and Sealed this
First Day of May, 2018

Andrei Iancu
*Director of the United States Patent and Trademark Office*